(12) United States Patent
Jessen et al.

(10) Patent No.: US 7,512,928 B2
(45) Date of Patent: Mar. 31, 2009

(54) SUB-RESOLUTION ASSIST FEATURE TO IMPROVE SYMMETRY FOR CONTACT HOLE LITHOGRAPHY

(75) Inventors: Scott William Jessen, Allen, TX (US); Mark Terry, Allen, TX (US); Robert Soper, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 602 days.

(21) Appl. No.: 11/202,205

(22) Filed: Aug. 12, 2005

(65) Prior Publication Data

US 2007/0035031 A1    Feb. 15, 2007

(51) Int. Cl.
*G06F 17/50* (2006.01)
(52) U.S. Cl. .............................. 716/21; 716/19; 716/20; 430/5; 430/30
(58) Field of Classification Search ............. 716/19–21; 430/5, 30
See application file for complete search history.

(56) References Cited

U.S. PATENT DOCUMENTS

| | | | |
|---|---|---|---|
| 6,046,792 A | 4/2000 | Van Der Werf et al. | |
| 6,627,361 B2 | 9/2003 | Bula et al. | 430/5 |
| 6,777,146 B1 | 8/2004 | Samuels | 430/30 |
| 6,887,625 B2 * | 5/2005 | Baselmans et al. | 430/5 |
| 7,424,699 B2 * | 9/2008 | O'Brien | 716/20 |
| 2004/0156029 A1 | 8/2004 | Hansen | 355/67 |
| 2004/0209170 A1 | 10/2004 | Broeke et al. | 430/5 |
| 2004/0248016 A1 * | 12/2004 | Lucas et al. | 430/5 |
| 2006/0040189 A1 * | 2/2006 | Yang | 430/5 |

* cited by examiner

*Primary Examiner*—Thuan Do
*Assistant Examiner*—Nghia M Doan
(74) *Attorney, Agent, or Firm*—Frederick J. Telecky, Jr.; Wade J. Brady, III

(57) ABSTRACT

A method of making a mask design having optical proximity correction features is provided. The method can include obtaining a target pattern comprising a plurality of target pattern features corresponding to a plurality of features to be imaged on a substrate. The method can also comprise generating a mask design comprising mask features corresponding to the plurality of features to be imaged on the substrate and controlling the aspect ratio of at least one of the features of the plurality of features to be imaged on the substrate by positioning a sub-resolution assist feature proximate to the corresponding mask feature.

7 Claims, 4 Drawing Sheets

SUB-RESOLUTION ASSIST FEATURE TO IMPROVE SYMMETRY FOR CONTACT HOLE LITHOGRAPHY

DESCRIPTION OF THE INVENTION

1. Field of the Invention

The subject matter of this application relates to photolithography. More particularly, the subject matter of this disclosure relates to photolithography methods and masks that use resolution enhancement techniques.

2. Background of the Invention

Lithographic projection apparatus (tools) can be used, for example, in the manufacture of integrated circuits (ICs). When using the various tools, a mask can be used that contains a circuit pattern corresponding to an individual layer of the IC, and this pattern can be imaged onto a target portion (e.g., comprising one or more dies) on a substrate, such as a silicon or other wafer comprising a semiconductor, that has been coated with a layer of radiation-sensitive material, such as a resist. In general, a single wafer may contain a network of adjacent target portions that can be successively irradiated using a projection system of the tool, one at a time. In one type of lithographic projection apparatus, each target portion is irradiated by exposing the entire mask pattern onto the target portion in one shot. In another apparatus, which is commonly referred to as a step-and-scan apparatus, each target portion is irradiated by progressively scanning the mask pattern under the projection beam in a given reference direction (the "scanning" direction) while synchronously scanning the substrate table parallel or anti-parallel to the scanning direction. Because the projection system typically has a magnification factor M, which is generally less than 1, the speed V at which the substrate table is scanned will be a factor M times that at which the mask table is scanned. More information with regard to lithographic apparatus can be found, for example, in U.S. Pat. No. 6,046,792, which is incorporated by reference herein in its entirety.

In a manufacturing process using a lithographic projection apparatus, a mask pattern can be imaged onto a substrate that is at least partially covered by a layer of resist. Prior to this imaging step, the substrate may undergo various procedures, such as, priming, resist coating, and a soft bake. After exposure, the substrate can be subjected to other procedures, such as a post-exposure bake (PEB), development, a hard bake, and a measurement/inspection of the image features. This array of procedures can be used as a basis to pattern an individual layer of a device, such as an IC. Such a patterned layer may then undergo various processes, such as etching, ion-implantation, doping, metallization, oxidation, chemical mechanical polishing (CMP), etc., all intended to complete an individual layer. If several layers are required, then part of all of the procedure, or a variant thereof, may need to be repeated for each new layer. Eventually, an array of devices can be present on the substrate. These devices can then be separated from one another by a technique such as dicing or sawing. Thereafter, the individual devices can be mounted on a carrier, connected to pins, etc.

The lithographic tool may be of a type having two or more substrate tables (and/or two or more mask tables). In such "multiple stage" devices, the additional tables may be used in parallel, or preparatory steps may be carried out on one or more tables while one or more other tables are being used for exposure.

The photolithography masks referred to above comprise geometric patterns corresponding to the circuit components to be integrated onto a substrate. The patterns used to create such masks are typically generated using computer-aided design (CAD) programs, sometimes called electronic design automation (EDA). Most CAD programs follow a set a predetermined design rules in order to create functional masks. These rules are set by processing and design limitations. For example, design rules can define the space tolerance between circuit devices, such as gates, capacitors, etc., or interconnect lines, so as to ensure that the circuit devices or lines do not interact with one another in an undesirable way.

One of the goals in IC fabrication is to faithfully reproduce the original circuit design on the wafer using the mask. Another goal is to use as much of the wafer real estate as possible. As the size of an IC is reduced and its density increases, however, the critical dimension (CD) of its corresponding mask pattern approaches the resolution limit of the optical exposure tool. The resolution for an exposure tool can be defined as the minimum feature sizes that the exposure tool can repeatedly expose on the wafer. The resolution value of present exposure tools often constrains the CD for many advanced IC designs.

Furthermore, the constant improvements in micro-processor speed, memory packing density, and low power consumption for micro-electronic components can be directly related to the ability of lithography techniques to transfer and form patterns onto the various layers of a semiconductor device. In order to keep pace with Moore's law and develop sub-wavelength resolution, it has become necessary to use a variety of resolution enhancement techniques (RET).

Historically, the Rayleigh criteria for resolution (R) and depth of focus (DOF) have been used to evaluate the performance of a given technology. The Rayleigh criteria has been defined by:

$$R = k_1 \lambda / NA \qquad (1)$$

$$DOF = \pm k_2 \lambda / NA^2 \qquad (2)$$

where $k_1$ and $k_2$ are process dependent factors, $\lambda$ is wavelength, and NA is numerical aperture. Depth of focus is one of the factors determining the resolution of the lithographic apparatus and is defined as the distance along the optical axis over which the image of the pattern is adequately sharp.

The control of the relative size of the illumination system numerical aperture (NA) has historically been used to optimize the resolution of a lithographic projection tool. Control of the NA with respect to the projection systems objective lens NA allows for modification of spatial coherence at the mask plane, commonly referred to as partial coherence σ. This can be accomplished through the specification of the condenser lens pupil in various illumination systems. Moreover, this can allow for manipulation of the optical processing of diffraction information. Optimization of the partial coherence of a projection imaging system can be accomplished using full circular illuminator apertures. By controlling the distribution of diffraction information in the objective lens with the illuminator pupil size, image modulation can be obtained. Illumination systems can be further refined by considering variations to full circular illumination apertures. A system where illumination is obliquely incident on the mask at an angle so that the zero and first diffraction orders are distributed on alternative sides of the optical axis may allow for improvements. Such an approach is generally referred to as off-axis illumination (OAI). OAI can improve resolution by illuminating the mask with radiation that is at an angle to the optical axis of the lens. The incidence of the radiation on the mask, which acts as a diffraction grating, can improve the contrast of the image by transmitting more of the diffracted orders through the lens. OAI techniques used with conventional masks can produce resolution enhancement effects similar to resolution enhancement effects obtained with phase shifted masks. Besides OAI, other RETs include optical proximity correction (OPC) of optical proximity errors (OPE), phase shifting masks (PSM), and sub-resolution assist features (SRAFs). Each technique may be used alone, or in combination with other techniques to enhance the resolution of the lithographic projection tool.

Printing mask features at near or below half of the optical exposure wavelength requires applying such resolution enhancement techniques, such as the various RETs. Problems remain, however. For example, the use of OAI can degrade the imaging of isolated geometries in the case of both dark-filed and bright-field mask types. As such, using OAI alone is unsuitable for printing random pitch features.

One such type of isolated geometry that cannot easily be printed using OAI is that of a contact hole. In the past, SRAFs have been used to improve the printing of isolated features, such as contact holes. For example, placing SRAFs adjacent to isolated features in a clear-field mask type, the isolated features can be made to behave as dense features, thereby achieving improved printing performance when exposed under OAI. However, the use of SRAFs has been limited to an attempt to improve the depth of focus of contacts. By focusing on dense feature performance only, one can optimize the illuminator to provide maximum DOF at a specific pitch. SRAF's can be inserted at larger pitches to improve the DOF dramatically by essentially changing the aerial image of the larger pitch feature to be similar to that of the optimal feature. More SRAFs can be inserted as the spacing allows so as to maximize the DOF of larger and larger pitch features. Moreover, the SRAFs that have been used in the past have been placed at a standard, equal position adjacent to the isolated features, i.e., each SRAF has been placed at the same distance to each isolated feature.

For example, FIG. 1A shows an exemplary mask layout according to prior techniques. As shown in FIG. 1A there are a plurality of contact hole patterns 10a-10d spaced away from each along the x-axis at a pitch $P_{x1}$, and spaced away from each other along the y-axis at a pitch $P_{y1}$. FIG. 1A also shows a plurality of contact hole patterns 12a-12b spaced away from patterns 10b and 10d along the x-axis at a pitch $P_{x2}$ and away from each other along the y-axis at a pitch $P_{y2}$, where $P_{x1} \neq P_{x2}$; $P_{y1} \neq P_{y2}$; $P_{x1} = P_{y1}$; and $P_{x1} \neq P_{y2}$. Further, as shown in FIG. 1A, previous RET techniques place SRAFs (20) at the same distance ($S_1$) from each mask feature.

One problem with the current SRAF approach of the past is that it forms asymmetric contact holes. For example, FIG. 1B shows a representation of the contact holes formed using the mask pattern shown in FIG. 1A. Mask features 10a-10d, which were equally spaced from each other with $P_{x1}=P_{y1}$, form contact holes 10a'-10d' that are relatively symmetric, as shown in FIG. 1B. However, mask features 12a and 12b, which were spaced at various pitches from each other and from mask features 10b and 10d, form asymmetrical contact holes, as shown as items 12a' and 12b' in FIG. 1B. The proximity effect of these configurations result in printed contact CDs which are too small to meet the printed contact (CT) design rules in the dense direction without violating a minimum mask spacing (allowed mask spacing due to the mask making process) in the dense direction. The small CD in the dense direction causes problem for subsequent processing steps in the manufacturing flow which cannot support this small dimension. To compensate for the small dense direction CD, the mask sizing in the opposite direction is increased until the dense direction sizing is achieved. The resulting printed CT suffers from printed CD asymmetry or delta. The larger CD direction may run the risk of violating design rules for layers immediately below and above the processing step in question.

Thus, there is a need to overcome these and other problems of the prior art to provide mask patters that can form symmetric contact holes and methods for their use.

SUMMARY OF THE INVENTION

In accordance with an embodiment of the invention, there is a method of making, a mask design having optical proximity correction features. The method can comprise obtaining a target pattern comprising a plurality of target pattern features corresponding to a plurality of features to be imaged on a substrate. The method can also comprise generating a mask design comprising mask features corresponding to the plurality of features to be imaged on the substrate and controlling the aspect ratio of at least one of the features of the plurality of features to be imaged on the substrate by positioning a sub-resolution assist feature proximate to the corresponding mask feature.

According to another embodiment of the invention, there is a mask for use in the manufacture of an integrated circuit device. The mask can comprise a transparent substrate having a plurality of mask features disposed thereon, where the plurality of mask features can comprise a first set of nearest neighbor mask features spaced substantially equidistant from each other along a first direction and a second set of nearest neighbor mask features spaced at nonequidistant distances from each other along the first direction. The mask can also comprise sub-resolution assist features spaced at various distances away from the plurality mask features, wherein the sub-resolution assist features are spaced away from the plurality of mask features as a function of the spacing between the nearest neighbor mask features.

According to another embodiment of the invention, there is a semiconductor device. The semiconductor device can comprise a first set of nearest neighbor contact holes formed in a substrate, wherein each of the contact holes in the first set are spaced substantially equidistant from each other along a first direction and a second set of nearest neighbor contact holes formed in the substrate, wherein each of the contact holes in the second set are spaced at nonequidistant distances from each other along the first direction. Moreover, each of the contact holes can be spaced from about 520 nm to about 800 nm from each other, and each of the contact holes can comprise a $CD_{y-x}$ of less than about 40 nm, where $CD_y$ is the critical dimension along a y axis and $CD_x$ is the critical dimension along an x axis.

According to another embodiment of the invention, there is an integrated circuit device formed according to a particular method. The method can comprise exposing a transparent substrate having a plurality of mask features disposed thereon to a light source. According to various embodiments, the plurality of mask features can comprise a first set of nearest neighbor mask features spaced substantially equidistant from each other along a first direction and a second set of nearest neighbor mask features spaced at different distances from each other along the first direction. The mask features can also comprise sub-resolution assist features spaced at various distances away from the plurality mask features, wherein the sub-resolution assist features are spaced away from the plurality of mask features as a function of the spacing between the nearest neighbor mask features.

According to another embodiment of the invention, there is a computer readable medium containing program code that configures a processor to perform a method for forming a mask design having optical proximity correction features. The computer readable medium can comprise program code for obtaining a target pattern comprising a plurality of target pattern features corresponding to a plurality of features to be imaged on a substrate, program code for generating a mask design comprising mask features corresponding to the plurality of features to be imaged on the substrate, and program code for controlling the aspect ratio of at least one of the features to be imaged on the substrate by positioning a sub-resolution assist feature proximate to the corresponding mask feature.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

Reference will now be made in detail to the present exemplary embodiments of the invention, examples of which are illustrated in the accompanying drawings. Wherever possible, the same reference numbers will be used throughout the drawings to refer to the same or like parts.

Although reference is made herein to the use of the invention in the manufacture of ICs, it is to be understood that the invention has many other possible applications. For example, it may be employed in the manufacture of integrated optical systems, guidance and detection patterns for magnetic domain memories, liquid crystal display panels, thin-film magnetic heads, etc. Further, one of ordinary skill in the art will appreciate that, in the context of such alternative applications, any use of the term "reticle", "wafer", or "die" in this text should be considered as being replaced by the more general terms "mask", "substrate", and "target portion", respectively.

In the present disclosure, the term "radiation" is used to encompass all types of electromagnetic radiation, including ultraviolet radiation (e.g., with a wavelength of, for example, 365, 248, 193, 157, or 126 nm and extreme ultraviolet radiation (e.g., with a wavelength of, for example in the range of 5 to 20 nm). The term "beam" is used to encompass various types of beams including beams of radiation and electrons.

As used herein, the term "equidistant" is understood to mean spaced at a substantially equal distant along a particular direction. Further, "nonequidistant" is understood to mean spaced at different distances, or not equidistant.

The term mask, as used herein, can be broadly interpreted as referring to generic pattern means that can be used to endow an incoming beam with a patterned cross-section, corresponding to a target pattern that is to be created in a target portion of the substrate.

As used herein the term sub-resolution assist feature (SRAF) is understood to be features that may be too narrow to be resolved by the optical lithographic system. SRAFs can be added to any side of a mask pattern to improve the sharpness of the mask pattern. One effect of SRAFs is to allow semi-isolated and isolated patterns to behave more like nested patterns (patterns in close proximity to each other).

As used herein, the term "nearest neighbor" is generally understood to mean the closest feature to a main feature along a predetermined direction.

A few examples of using the method of the present invention to print contact holes are set forth herein. It should be noted, however, that the present invention is not limited to printing contact holes. Indeed, it can be used to print various mask patterns, also called mask features or mask designs.

Figure 1A:
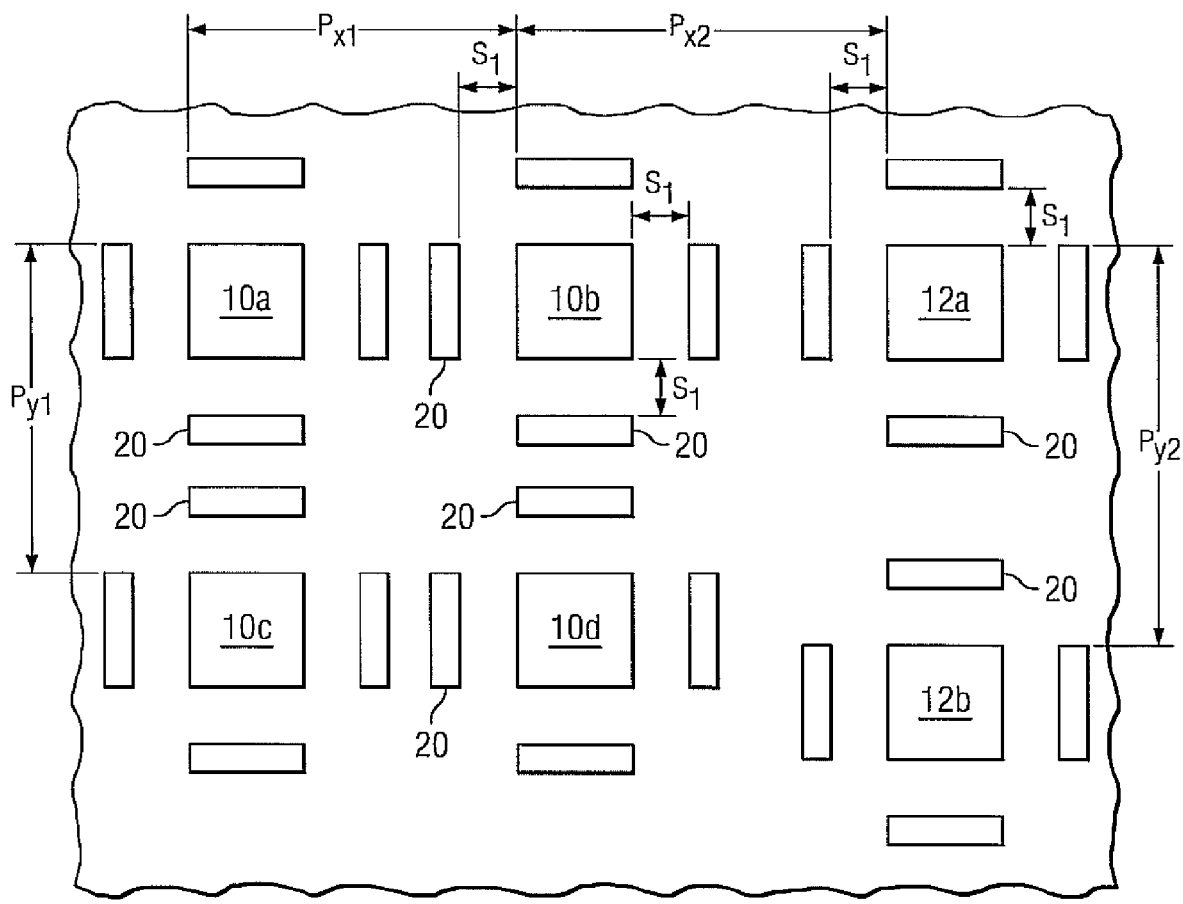
FIG. 1A depicts an exemplary mask layout according to prior techniques.
Figure 1B:
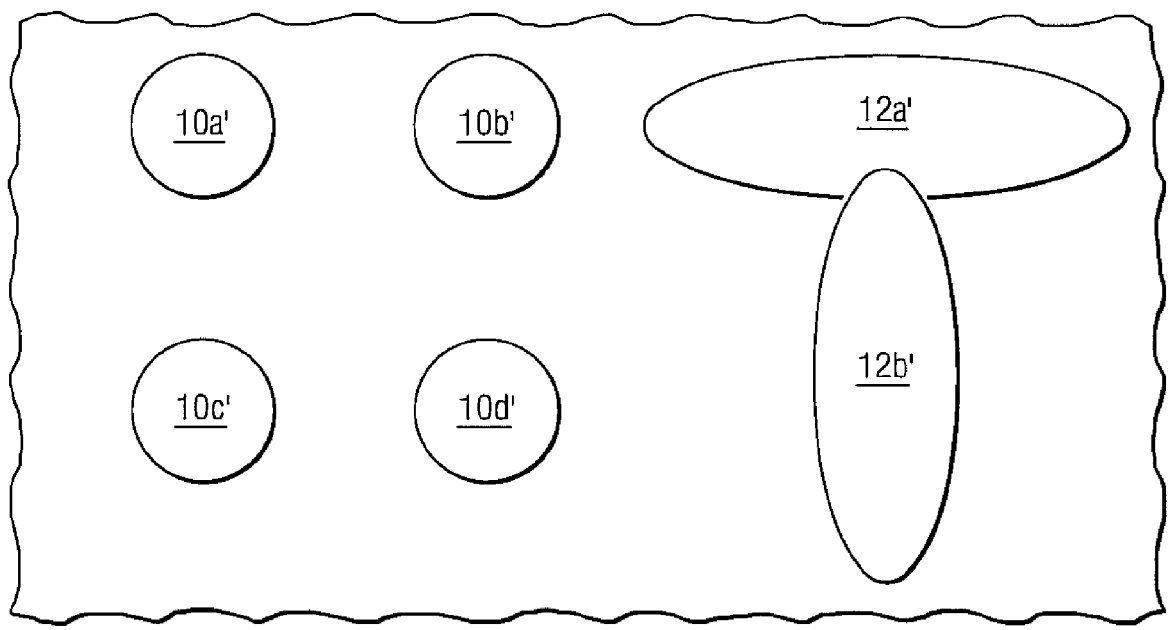
FIG. 1B depicts features formed using the mask pattern shown in FIG. 1A.
Figure 2A:
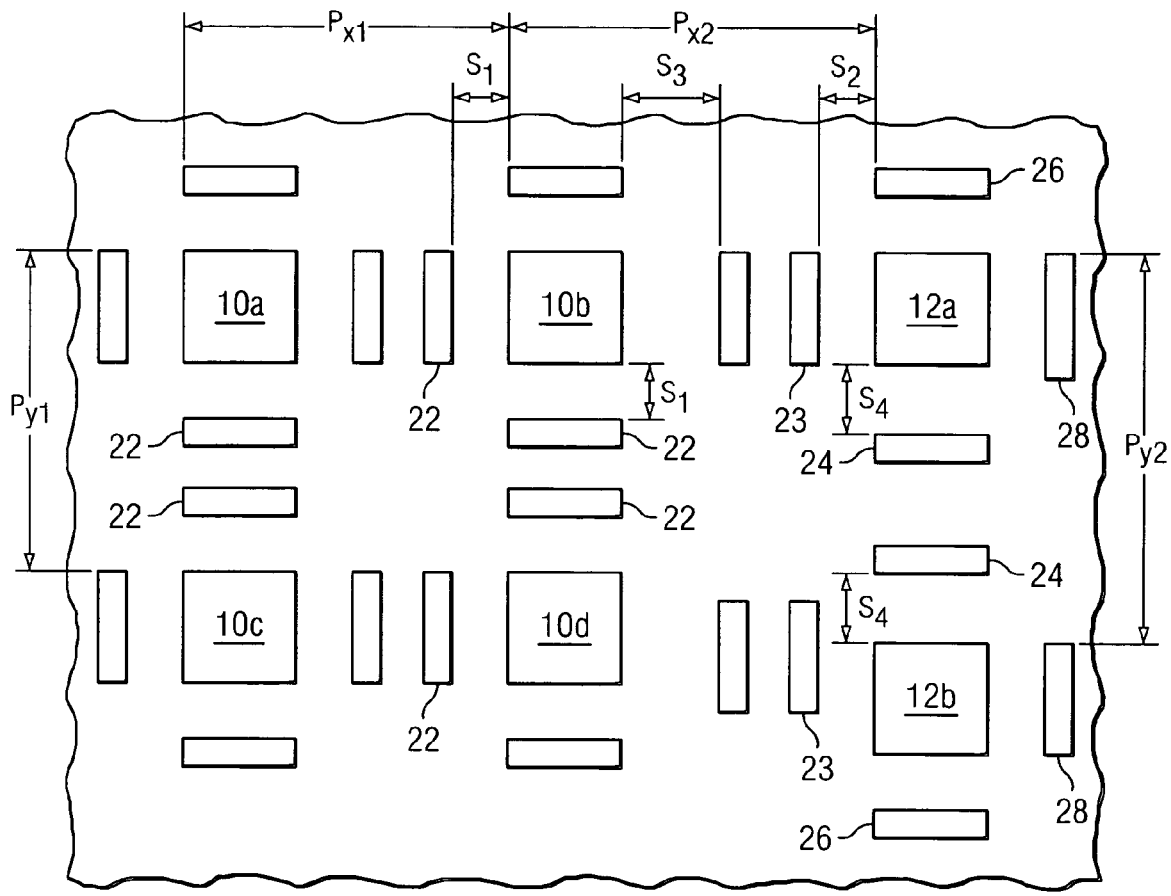
FIG. 2A depicts an exemplary mask layout according to various embodiments of the disclosure.

As used herein, the term critical dimension (CD) is understood to mean the minimum dimension needed to print FIG. 2A depicts a portion of an exemplary mask pattern according to various embodiments of the invention. As shown in FIG. 2A, there are a plurality of mask features 10a-10d and 12a-12b that can be used to pattern contact holes on a substrate. In the exemplary target pattern shown in FIG. 2A, some of the mask features can be considered to be arranged in an array. Further, some of the mask features shown in FIG. 2A are regularly spaced, and are equidistant from each other while other mask features are spaced at different distances, or nonequidistant. For example, mask features 10a and 10b and mask features 10c and 10d are spaced equidistant from each other at a distance $(x_1)$, respectively, and at a pitch $P_{x1}$ along a first direction, such as the x-axis. Mask features 10a and 10c and mask features $10_b$ and 10d are spaced equidistant from each other at a distance $(y_1)$, respectively, and at a pitch $P_{y1}$ along a second direction, such as the y-axis. In contrast, mask features 12a and 12b are spaced at a distances of $(x_2)$ from mask features 10b and 10d, respectively, and at a pitch $P_{x2}$ along the x-axis. In this example, mask feature 12a is spaced from mask feature 12b at a distance Of $(y_2)$ and at a pitch $P_{y2}$ along the y-axis. In this case, and $(x_1) \neq (x_2)$ and $(y_1) \neq (y_2)$, and thus, some mask features can be considered to be spaced at nonequidistant distances from each other. Moreover, in this example, $P_{x1}=P_{y1}$; $P_{x1} \neq P_{x2}$; $P_{x1} \neq P_{y2}$; and $P_{y1} \neq P_{y2}$.

FIG. 2A also depicts a plurality of SRAF features 22, 23, 24, 26, and 28 positioned adjacent to a mask feature. According to various embodiments, some SRAFs shown in FIG. 2A are regularly spaced, or equidistant from a corresponding mask feature while other SRAFs are spaced at different distances, or nonequidistant. For example, SRAFs 22, which are proximate to regularly spaced mask features 10a-10d, are each positioned equidistant, and adjacent to the mask features 10a-10d at the same spacing, for example $S_1$. However, there are SRAFs spaced from mask features 10b and 10d at a spacing of $S_3$ and SRAFs 23 are spaced from mask features 12a and 12b at a spacing of $S_2$. In this example, $S_1 \neq S_2 \neq S_3$. SRAFs spaced at the same distance from the mask feature can be considered spaced equidistant, examples of which are SRAFs 22 spaced from mask features 10a-10d. In contrast, SRAFs spaced at different distances from the mask features can be considered spaced nonequidistant, such as how SRAFs 23, 24, 26, and 28, which are spaced from mask features 10b, 10d, 12a, and 12b. As will be understood, the arrangements shown in FIG. 2A are exemplary only.

According to various embodiments, the various mask features and SRAFs can be arranged in any configuration. What can be understood, however, is that the SRAF spacing from the mask features will vary depending on the proximity of a one mask feature to another mask feature.

According to various embodiments, by varying the spacing of the SRAFs from the mask features, the aspect ratio of the printed pattern can be controlled. For example, the SRAF spacing changes the aerial image of the feature in question in such a way as to allow the feature to print symmetrically.

For example, the SRAFs can be placed adjacent to the mask feature based on various' relationships. According to an embodiment of the invention, an SRAF can be placed adjacent to the mask feature based on $CD_x/CD_y$. According to various embodiments, varying the SRAF spacing can provide printed features, such as a contact hole, that have substantially symmetric aspect ratios. For example, using embodiments described herein can provide printed features that have an aspect ratio from about 1.0 to about 1.5. In still further embodiments, the aspect ratio can be from about 1.0 to about 1.3, and in other embodiments, the aspect ratio can be from 1.0 to about 1.2.

Alternatively, other functional relationships can be determined that will permit symmetrical contacts to be printed on the substrate. For example, SRAF spacings may be adjusted according to a model based environment where the optimal placement of the SRAF can be determined by an aerial image analysis. This analysis can involve the predicted CD in y and x directions.

Moreover, according to various embodiments, a look-up table can be generated to provide guidance as to where to position SRAFs with respect to mask features so as to provide a predetermined aspect ratio for a printed pattern. For example, the look-up table can include information that relates the spacing of an SRAF from a mask feature that has a particular pitch to the resulting aspect ratio or $CD_{y-x}$ of the printed image. $CD_{y-x}$ is understood to be the difference in the printed critical dimension along a y axis ($CD_y$) and the critical dimension along an x axis ($CD_x$)). For example a printed contact having the dimensions of 120 nm along an x axis and 145 nm along a y axis has a $CD_{y-x}$ of 25 nm.

According to various embodiments, the lookup table can be generated by empirical analysis or by well anchored simulations of printed wafer CD's as a function of SRAF spacing. Program code can then be generated that can apply the rules of the lookup table to a given geometry in the drawn database layout.

Figure 3:
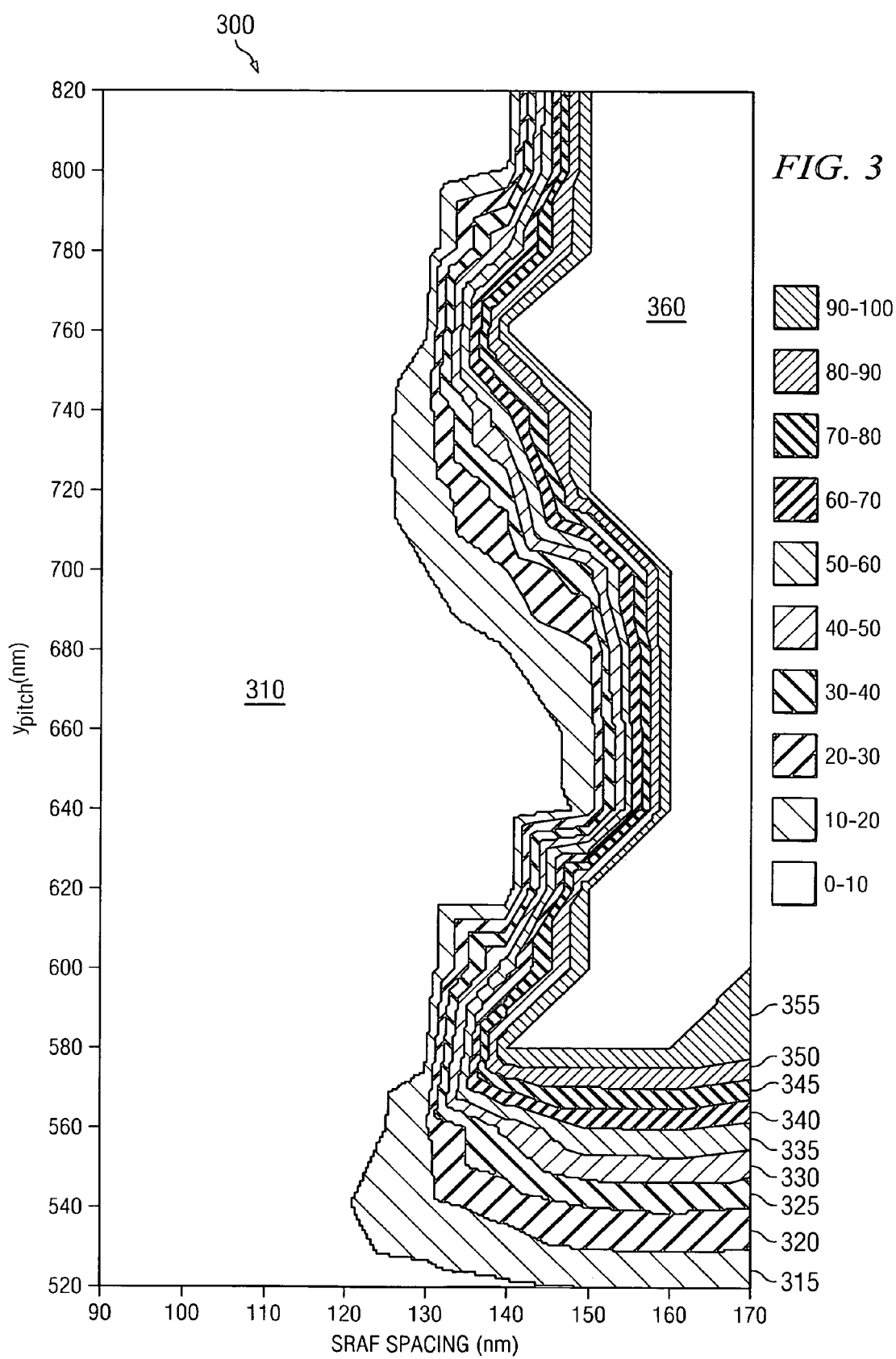
FIG. 3 is a graph of the effect of SRAF placement on printed contact hole $CD_{y-x}$ according to various embodiments of the disclosure.

FIG. 3 shows result of an exemplary simulation of the effects of SRAF placement with respect to a mask feature on a mask on the $CD_{y-x}$ of printed images. A complementary plot of FIG. 3 can be generated, however, to show the effects that SRAF placement, with respect to a mask feature on a mask, has on the aspect ratio of printed images.

FIG. 3 plots SRAF spacing in nm versus mask feature pitch along a given direction (the y direction). As can be seen, by varying the spacing of the SRAF from a mask feature, the $CD_{y-x}$ can be controlled to allow symmetric contact hole printing.

For example, the combination of SRAF spacing away from a mask feature and mask feature pitch that conforms to the parameters contained in the region labeled 310 results in printed features having a $CD_{y-x}$ of from about 0 nm to about 10 nm. Similarly, the combination of SRAF spacing away from a mask feature and mask feature pitch that conforms to the parameters contained in the region labeled 315 results in printed features having a $CD_{y-x}$ of from about 10 nm to about 20 nm. The combination of SRAF spacing away from a mask feature and mask feature pitch that conforms to the parameters contained in the region labeled 320 results in printed features having a $CD_{y-x}$ of from about 20 nm to about 30 nm. And the combination of SRAF spacing away from a mask feature and mask feature pitch that conforms to the parameters contained in the regions labeled 325, 330, 335, 340, 345, 350, 355, and 360 result in printed features having $CD_{y-x}$ of about 30 nm to about 40 nm; of about 40 nm to about 50 nm; of about 50 nm to about 60 nm; of about 60 nm to about 70 nm; of about 70 nm to about 80 nm; of about 80 nm to about 90 nm; and of about 90 nm to about 100 nm, respectively.

It is to be noted, however, that other combinations of SRAF spacing and mask feature pitch along a given direction can be determined that can yield acceptable $CD_{y-x}$ and aspect ratios of printed features. These different combinations may be a result of different radiation sources, beams, lenses, or other variations in the lithography tool. According to various embodiments, however, the $CD_{y-x}$ or aspect ratio of a printed feature can be controlled by adjusting the SRAF spacing adjacent a mask feature based on the pitch of the feature.

A mask that conforms to various embodiments disclosed herein can be used to fabricate an IC, such as a semiconductor device, that has a plurality of contact holes with an aspect ratio from about 1.0 to about 1.5. For example, the semiconductor device can include a first set of nearest neighbor contact holes formed in a substrate with each of the contact holes in the first set being spaced substantially equidistant from each other along a first direction, such as an x-axis. The semiconductor device can also include a second set of nearest neighbor contact holes formed in the substrate with each contact hole in the second set being spaced at nonequidistant distances from each other along the first direction. In an exemplary embodiment where the mask used conforms to the relationships defined in FIG. 3, each of the contact holes can be spaced from about 100 nm to about 300 nm from each other.

Figure 2B:
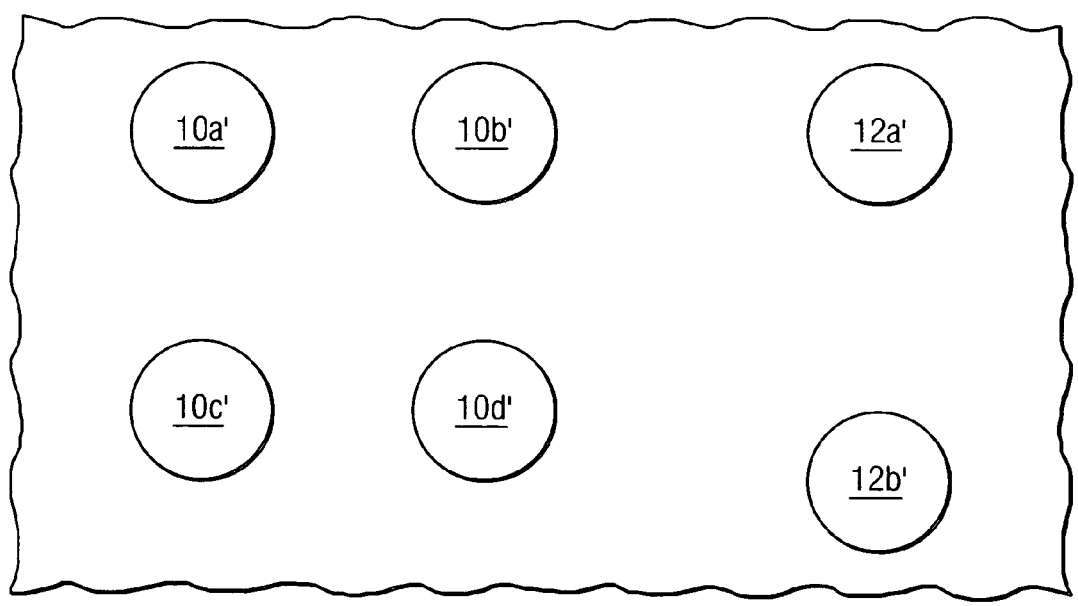
FIG. 2B depicts features formed using the mask pattern shown in FIG. 2A.
Figure 4:
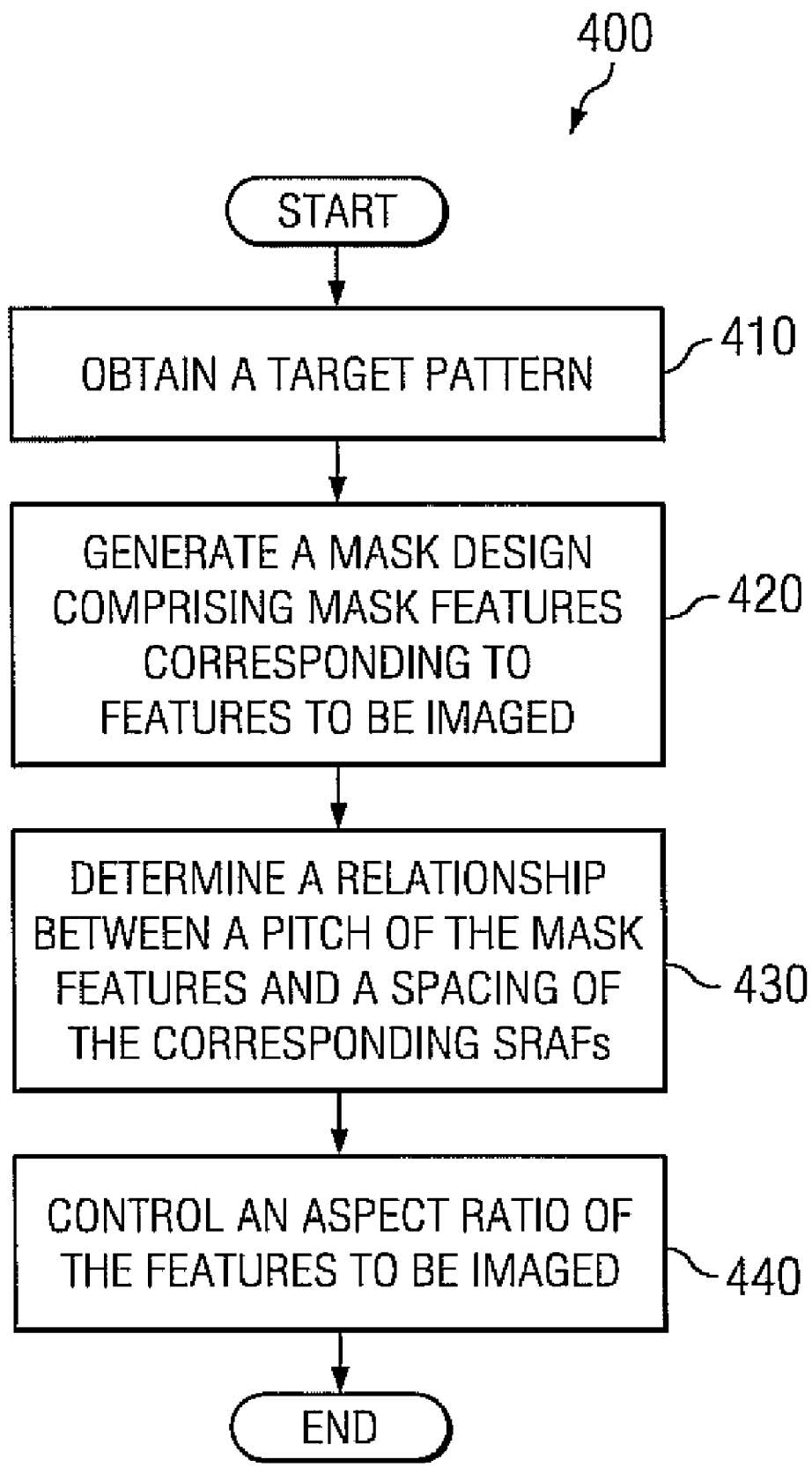
FIG. 4 illustrates a flow diagram view of a method for making a mask design having optical proximity correction features according to various embodiments of the disclosure.

FIG. 4 is a flow diagram view of a method for making a mask design having optical proximity correction features according to various embodiments of the invention. Method 400 may start in step 410 by obtaining or retrieving a target pattern, which has a plurality of target pattern features corresponding to a plurality of features (e.g., contact holes 10a'-10d' and 12a'-12b' as shown in FIG. 2B) to be imaged on a substrate. Next, in step 420, a mask design, which has mask features (e.g., mask features 10a-d and 12 a-b as shown in FIG. 2A) corresponding to the plurality of features to be imaged on the substrate, may be generated. The mask features may be spaced along a first direction (e.g., x) or a second direction (e.g., y) by a pitch (e.g., $P_{x1}$, $P_{x2}$, $P_{y1}$, or $P_{y2}$ as shown in FIG. 2A). The method may continue at step 430, where a relationship between a pitch of the mask features and a spacing (e.g., $S_1$ $S_2$, $S_3$, or $S_4$ as shown in FIG. 2A) of sub-resolution assist features and their corresponding mask features may be determined to indicate or estimate one or more aspect ratios of the features to be imaged on the substrate. Then, in step 440, at least one of the aspect ratios of the features to be imaged may be controlled by positioning a sub-resolution assist feature (e.g., SRAFs 22-28 as shown in FIG. 2A) proximate to its corresponding mask feature at a distance determined based on the pitch between the corresponding mask feature and other mask features. After controlling the aspect ratios of the features to be imaged, method 400 may then be complete and subsequently ended.

According to various embodiments, the IC can be formed by exposing a mask as described herein to a source of radiation or beam. According to an embodiment, the second set of nearest neighbor mask features, as described above, can be spaced along the first direction at a distance greater than or equal to a critical distance ($CD_x$).

According to still further embodiments, a computer readable medium can be provided that configures a processor to perform a method for forming a mask having OPC. The computer readable medium can include program code for obtaining and storing a target patter that includes a plurality of target pattern features corresponding to a plurality of features to be imaged on a substrate. The target pattern can be obtained directly from a user or can be generated from a computer aided design (CAD) program. The computer readable medium can also include program code for generating a mask design that includes mask features corresponding to the plurality of features to be imaged on the substrate. The computer readable medium can control the aspect ratio of the at least one of the features formed on the substrate by controlling the positioning of an SRAF to be placed adjacent to the corresponding mask feature.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of making a mask design having optical proximity correction features, comprising:
    obtaining a target pattern comprising a plurality of target pattern features corresponding to a plurality of features to be imaged on a substrate;
    generating a mask design comprising mask features corresponding to the plurality of features to be imaged on the substrate, wherein a first and a second mask feature of the mask features are spaced along a first direction by a pitch ($P_{x1}$) and the second mask feature is spaced from a third mask feature of the mask features along the first direction by a pitch ($P_{x2}$);
    determining a relationship between (i) a pitch of the first and second mask features and the second and third mask features, and (ii) a spacing of sub-resolution assist features from their corresponding first and third mask features, wherein the relationship provides an indication of an aspect ratio of at least one of the features to be imaged on the substrate corresponding to one of the first and third mask features; and
    controlling the aspect ratio of the at least one of the features to be imaged on the substrate by positioning one of the sub-resolution assist features proximate to the corresponding mask feature, wherein the sub-resolution assist feature corresponding to the first mask feature is spaced from the first mask feature by a distance ($x_1$), wherein ($x_1$) is determined based on ($P_{x1}$), and wherein the sub-resolution assist feature corresponding to the third mask feature is spaced from the third mask feature by a distance ($x_2$), such that ($x_2$) approximately equals ($x_1$) when ($P_{x2}$) approximately equals ($P_{x1}$), and ($x_2$) is different from ($x_1$) when ($P_{x2}$) is different from ($P_{x1}$).

2. The method of making a mask design according to claim 1, wherein the plurality of target pattern features are arranged in an array, and wherein a first set of target pattern features in the array are spaced substantially equidistant from each other along a first direction, and wherein a second set of target pattern features are spaced at nonequidistant distances from each other along the first direction, and further wherein the sub-resolution assist features used to control the aspect ratio of the features to be imaged on the substrate of the first set of target pattern features are separated from the mask features corresponding to the first set of target pattern features by a distance ($x_1$), and wherein the sub-resolution assist features used to control the aspect ratio of the features to be imaged on the substrate of the second set of target pattern features are separated from the mask features corresponding to the second set of target pattern features by a distance ($x_2$), wherein ($x_1$) is different than ($x_2$).

3. The method of making a mask design according to claim 1, wherein the sub-resolution assist features are positioned proximate to the corresponding mask feature based on a relationship between a critical dimension ($CD_x$) of features along a first direction and a critical dimension ($CD_y$) of features along a second direction.

4. The method of making a mask design according to claim 1, wherein the aspect ratio of the at least one of the feature on the substrate is from about 1.0 to about 1.5.

5. The method of making a mask design according to claim 1 further comprising:
    referencing a look-up table to determine where to position the sub-resolution assist feature proximate to the corresponding mask feature, wherein the look-up table comprises information relating sub-resolution assist feature spacing and pitch of the mask features to the aspect ratio of the features to be imaged on the substrate.

6. A computer readable medium containing program code that configures a processor to perform a method for forming a mask design having optical proximity correction features, comprising:
    program code for obtaining a target pattern comprising a plurality of target pattern features corresponding to a plurality of features to be imaged on a substrate;
    program code for generating a mask design comprising mask features corresponding to the plurality of features to be imaged on the substrate, wherein a first and a second mask feature of the mask features are spaced along a first direction by a pitch ($P_{x1}$) and the second mask feature is spaced from a third mask feature of the mask features along the first direction by a pitch ($P_{x2}$);
    program code for determining a relationship between (i) a pitch of the first and second mask features and the second and third mask features, and (ii) a spacing of sub-resolution assist features from their corresponding first and third mask features, wherein the relationship provides an indication of an aspect ratio of at least one of the features to be imaged on the substrate corresponding to one of the first and third mask features; and
    program code for controlling the aspect ratio of the at least one of the features to be imaged on the substrate by positioning one of the sub-resolution assist features proximate to the corresponding mask feature, wherein the sub-resolution assist feature corresponding to the first mask feature is spaced from the first mask feature by a distance ($x_1$), wherein ($x_1$) is determined based on ($P_{x1}$), and wherein the sub-resolution assist feature corresponding to the third mask feature is spaced from the third mask feature by a distance ($x_2$), such that ($x_2$) approximately equals ($x_1$) when ($P_{x2}$) approximately equals ($P_{x1}$), and ($x_2$) is different from ($x_1$) when ($P_2$) is different from ($P_{x1}$).

7. The computer readable medium according to claim 6, wherein the program code for controlling the aspect ratio further comprises a look-up table relating sub-resolution assist feature spacing and pitch of the mask features to the aspect ratio of the features to be imaged on the substrate.

* * * * *